(12) United States Patent
Zhang et al.

(10) Patent No.: US 11,069,604 B2
(45) Date of Patent: Jul. 20, 2021

(54) SEMICONDUCTOR PACKAGE AND METHOD OF MAKING THE SAME

(71) Applicant: Alpha and Omega Semiconductor (Cayman) Ltd., Grand Cayman (KY)

(72) Inventors: Xiaotian Zhang, San Jose, CA (US); Yan Xun Xue, Los Gatos, CA (US); Long-Ching Wang, Cupertino, CA (US); Yueh-Se Ho, Sunnyvale, CA (US); Zhiqiang Niu, Santa Clara, CA (US)

(73) Assignee: ALPHA AND OMEGA SEMICONDUCTOR (CAYMAN) LTD. GRAND, Grand Cayman (KY)

( * ) Notice: Subject to any disclaimer, the term of this patent is extended or adjusted under 35 U.S.C. 154(b) by 115 days.

(21) Appl. No.: 16/224,354

(22) Filed: Dec. 18, 2018

(65) Prior Publication Data

US 2020/0194395 A1    Jun. 18, 2020

(51) Int. Cl.
*H01L 23/31* (2006.01)
*H01L 23/495* (2006.01)
(Continued)

(52) U.S. Cl.
CPC ...... *H01L 23/49805* (2013.01); *H01L 21/561* (2013.01); *H01L 21/568* (2013.01);
(Continued)

(58) Field of Classification Search
CPC ... H01L 21/561; H01L 21/568; H01L 21/486; H01L 21/6835; H01L 21/6836; H01L 21/4832; H01L 2221/68372; H01L 2221/58359; H01L 23/481; H01L 23/49827; H01L 23/5384; H01L 23/3107; H01L 23/3114; H01L 23/3135; H01L 23/49517; H01L 23/49524; H01L 23/49527; H01L 23/49531; H01L 23/49562; H01L 23/49575; H01L 23/49541; H01L 23/49805; H01L 23/49838; H01L 23/49844; H01L 23/5386;
(Continued)

(56) References Cited

U.S. PATENT DOCUMENTS 9,754,864 B1    9/2017  Xue et al.
2010/0144101 A1*  6/2010  Chow ............... H01L 21/56
                                                        438/127
(Continued)

FOREIGN PATENT DOCUMENTS

CN    108172551 A  *  6/2018  ........... H01L 21/561

*Primary Examiner* — Yu Chen
(74) *Attorney, Agent, or Firm* — Chen-Chi Lin

(57) ABSTRACT

A semiconductor package has a plurality of pillars or portions of a plurality of lead strips, a plurality of semiconductor devices, one or two molding encapsulations and a plurality of electrical interconnections. The semiconductor package excludes a wire. The semiconductor package excludes a clip. A method is applied to fabricate semiconductor packages. The method includes providing a removable carrier; forming a plurality of pillars or a plurality of lead strips; attaching a plurality of semiconductor devices; forming one or two molding encapsulations; forming a plurality of electrical interconnections and removing the removable carrier. The method may further include a singulation process.

14 Claims, 17 Drawing Sheets

(51) Int. Cl.
   *H01L 21/56* (2006.01)
   *H01L 23/498* (2006.01)
   *H01L 23/538* (2006.01)
   *H01L 25/16* (2006.01)

(52) U.S. Cl.
   CPC ...... *H01L 23/3107* (2013.01); *H01L 23/3135* (2013.01); *H01L 23/49562* (2013.01); *H01L 23/49575* (2013.01); *H01L 23/49844* (2013.01); *H01L 23/49861* (2013.01); *H01L 23/5386* (2013.01); *H01L 23/5389* (2013.01); *H01L 25/16* (2013.01); *H01L 2221/68372* (2013.01); *H01L 2224/02371* (2013.01); *H01L 2224/82005* (2013.01); *H01L 2924/01029* (2013.01)

(58) Field of Classification Search
   CPC ........... H01L 23/5389; H01L 23/49861; H01L 24/19; H01L 2224/19; H01L 2224/221; H01L 2224/24137; H01L 2224/24175; H01L 2224/24226; H01L 2224/24246; H01L 2224/2518; H01L 2224/0237; H01L 2224/02373; H01L 2224/02381; H01L 2224/02379; H01L 2224/06182; H01L 2224/82005; H01L 25/0665; H01L 25/072; H01L 2225/06548; H01L 2924/18162; H01L 2924/182; H01L 2221/68359

See application file for complete search history.

(56) References Cited

U.S. PATENT DOCUMENTS

| | | | |
|---|---|---|---|
| 2010/0290191 A1 | 11/2010 | Lin et al. | |
| 2014/0210099 A1* | 7/2014 | Hu | H01L 24/06 257/774 |
| 2016/0307872 A1* | 10/2016 | Chen | H01L 21/78 |
| 2017/0062383 A1 | 3/2017 | Yee et al. | |
| 2018/0269188 A1* | 9/2018 | Yu | H01L 23/5384 |
| 2019/0006288 A1* | 1/2019 | Wang | H01L 21/6836 |
| 2019/0273017 A1* | 9/2019 | Palm | H01L 23/5329 |
| 2020/0194347 A1* | 6/2020 | Xue | H01L 21/823475 |

* cited by examiner

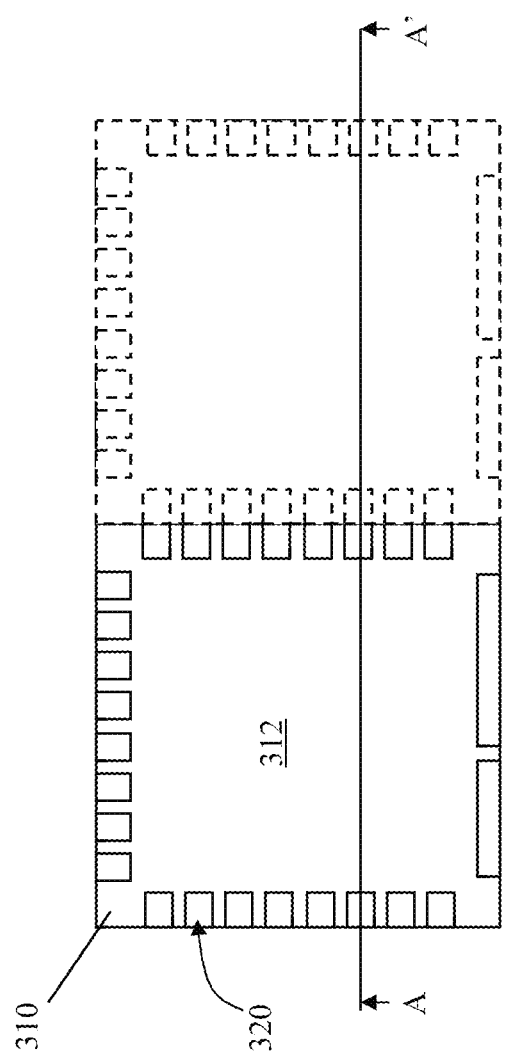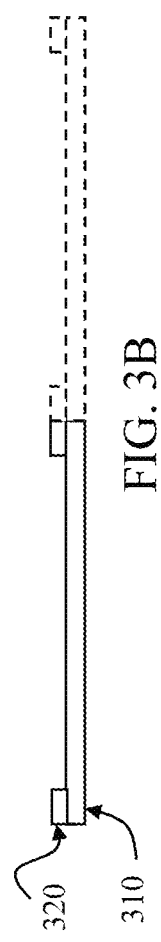
FIG. 3A
FIG. 3B

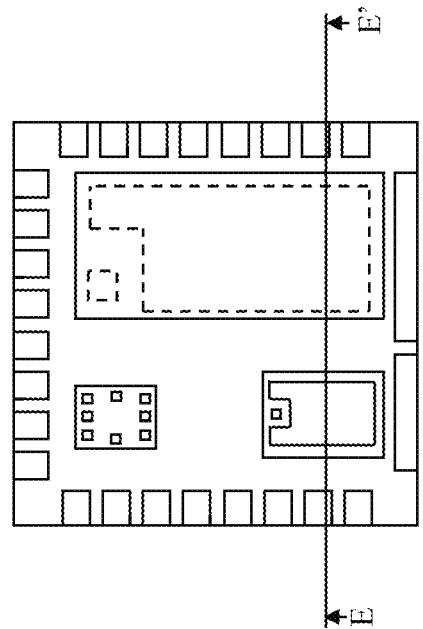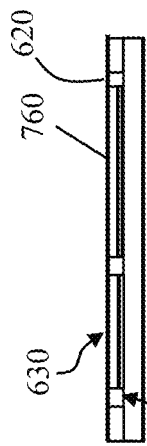
FIG. 7A
FIG. 7B
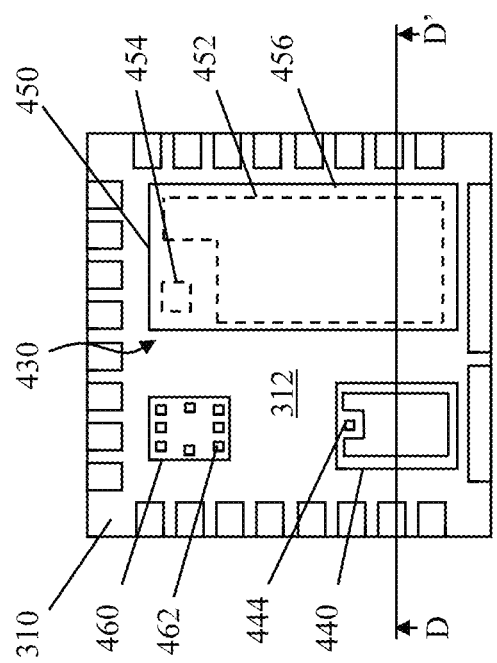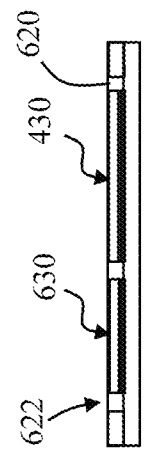
FIG. 6A
FIG. 6B

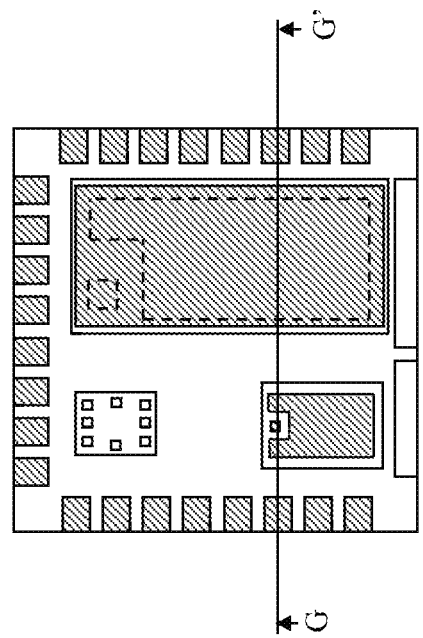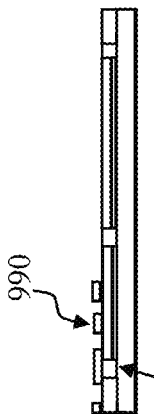
FIG. 9A
FIG. 9B
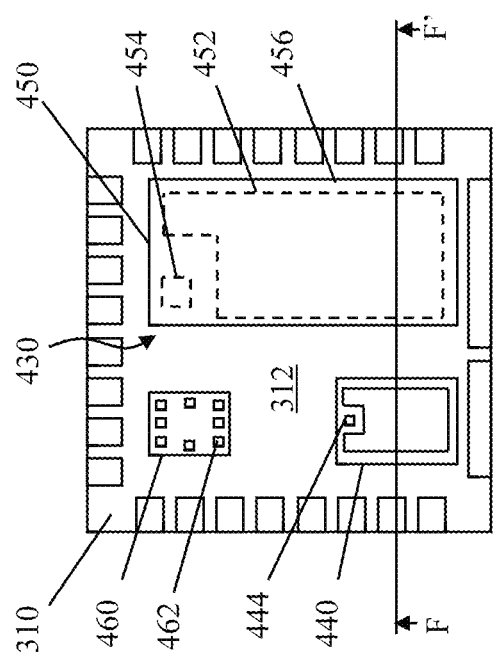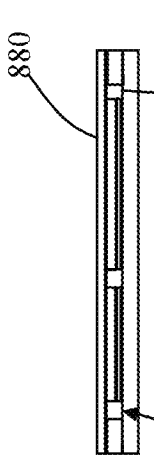
FIG. 8A
FIG. 8B

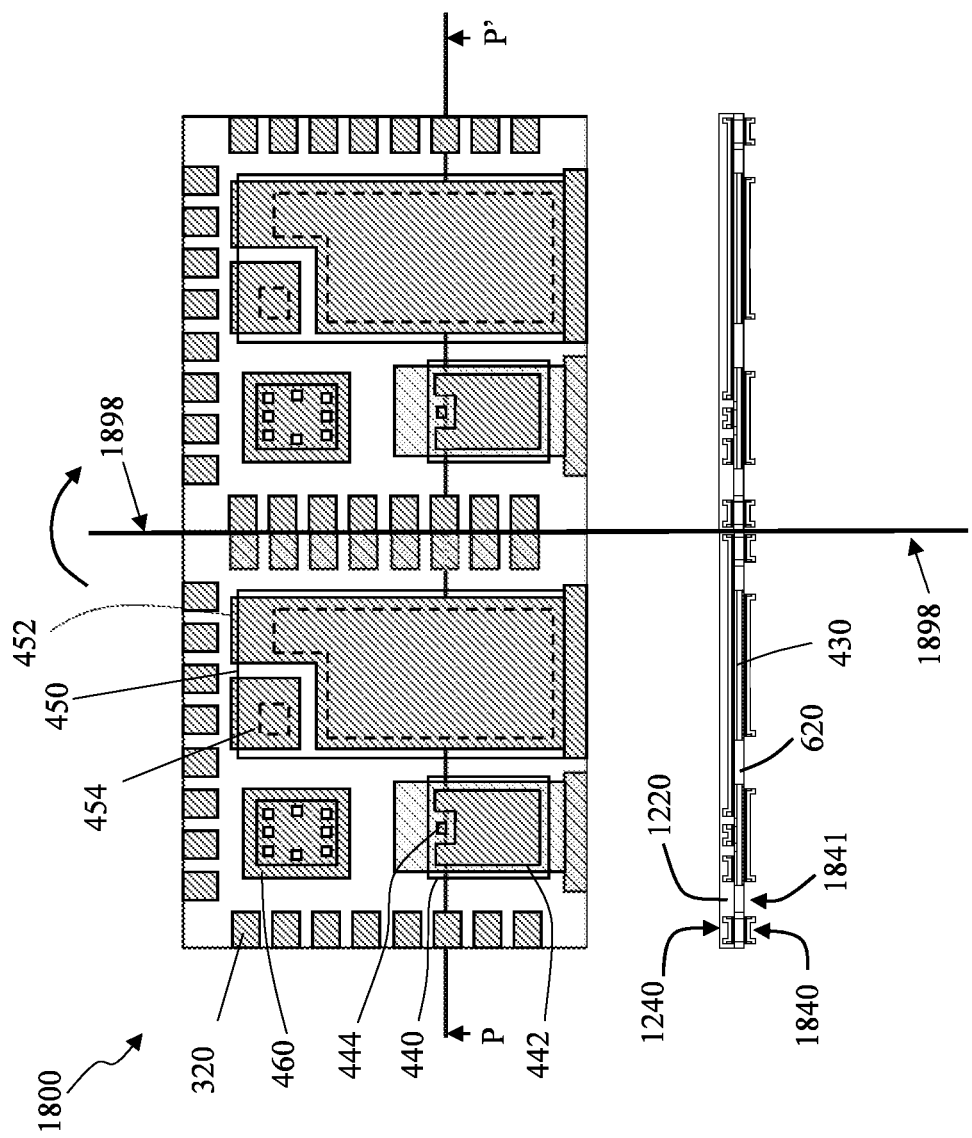

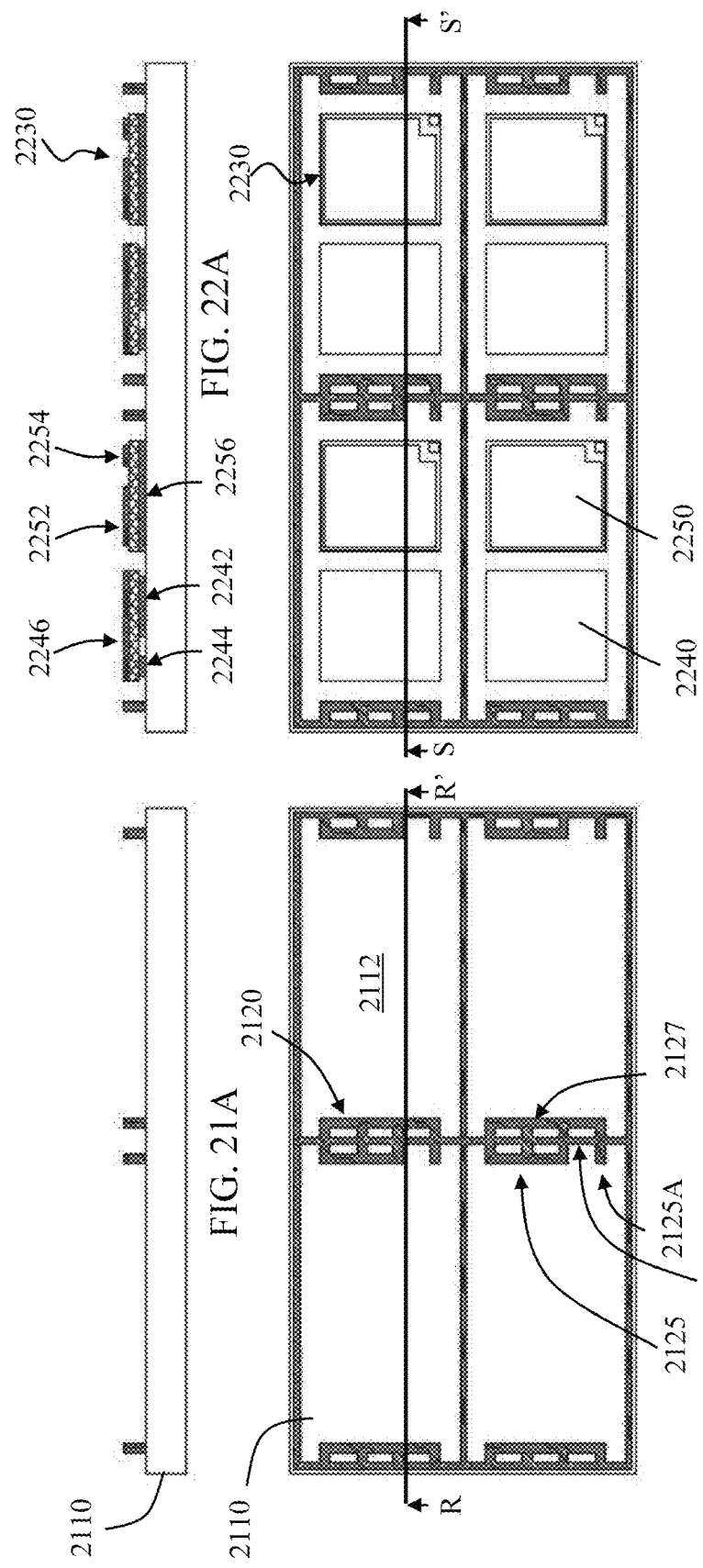

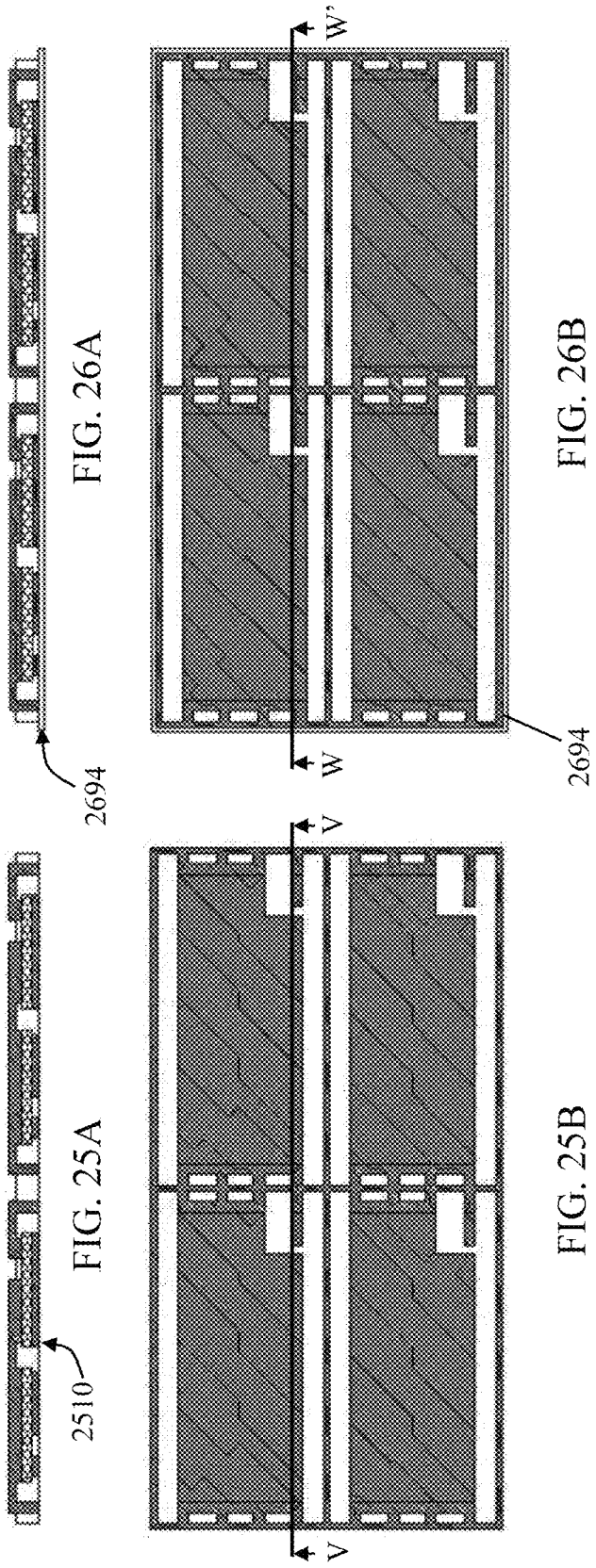

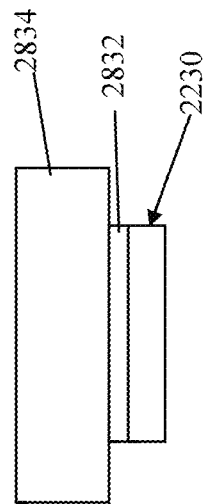
FIG. 28
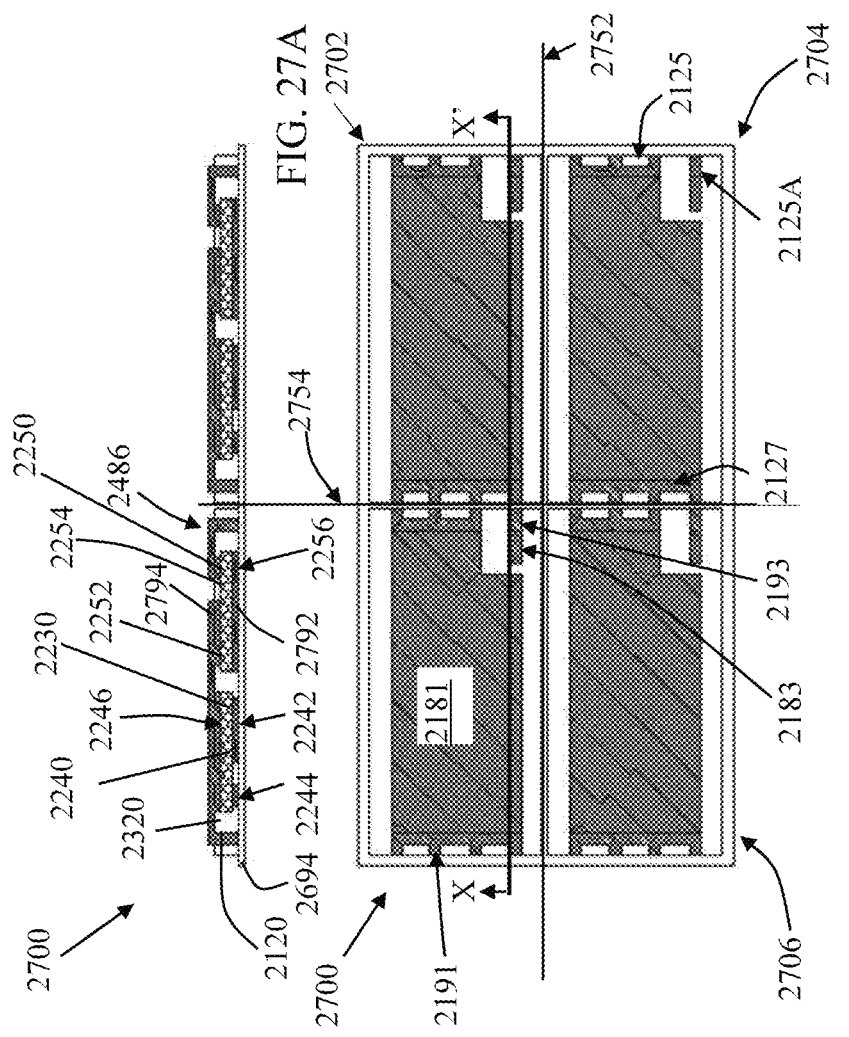
FIG. 27A
FIG. 27B

US 11,069,604 B2

SEMICONDUCTOR PACKAGE AND METHOD OF MAKING THE SAME

CROSS-REFERENCE TO RELATED APPLICATIONS

The Disclosure made in the patent application Ser. No. 15/191,414, filed on Jun. 23, 2016 and issued as U.S. Pat. No. 9,754,864 on Sep. 5, 2017, is hereby incorporated by reference.

FIELD OF THE INVENTION

This invention relates generally to a semiconductor package and a method of fabricating the semiconductor package. More particularly, the present invention relates to the semiconductor package excluding a wire and excluding a clip.

BACKGROUND OF THE INVENTION

In power management application, co-package a pair of high side (HS) and low side (LS) metal-oxide semiconductor field-effect transistors (MOSFETs) in one package is very popular. A traditional driver and MOSFET module (DrMOS) uses wires and clips to connect chips to chips and to connect chips to leads. Wires result in higher resistance and higher inductance. Clips results in higher stresses applied on the semiconductor devices.

The semiconductor package of present disclosure excludes a wire and excludes a clip. The advantage of the present disclosure includes being electrical routable, scalable to large panel manufacturing, not using die attaching solder containing lead (not environmental friendly), low resistance, low inductance, less stress, increased thermal dissipation, simpler assembly process, and a reduced form factor.

SUMMARY OF THE INVENTION

The present invention discloses a semiconductor package having a plurality of pillars or a plurality of lead strips, a plurality of semiconductor devices, one or two molding encapsulations and a plurality of electrical interconnections. The semiconductor package excludes a wire. The semiconductor package excludes a clip. A method is applied to fabricate semiconductor packages. The method includes providing a removable carrier; forming a plurality of pillars or a plurality of lead strips; attaching a plurality of semiconductor devices; forming one or two molding encapsulations; forming a plurality of electrical interconnections and removing the removable carrier. The method may further include a singulation process.

The semiconductor package includes a first metal-oxide semiconductor field-effect transistors (MOSFET) and a second MOSFET. One of the first MOSFET and the second MOSFET is flipped so that a source electrode is at a bottom surface.

BRIEF DESCRIPTION OF THE DRAWINGS

FIGS. 3A, 4A, 5A, 6A, 7A, 8A, 9A, 10A, 11A, 12A, 13A, 14A, 15A, 16A, 17A, and 18A show top views and FIGS. 3B, 4B, 5B, 6B, 7B, 8B, 9B, 10B, 11B, 12B, 13B, 14B, 15B, 16B, 17B, and 18B show cross sectional views along AA, BB, CC, DD, EE, FF, GG, HH, II, JJ, KK, LL, MM, NN, OO, and PP of steps of the process to fabricate the semiconductor packages of FIG. 1 in examples of the present disclosure.

FIGS. 20A, 21B, 22B, 23B, 24B, 25B, 26B, and 27B show top views and FIGS. 20B, 21A, 22A, 23A, 24A, 25A, 26A, and 27A show cross sectional views along QQ, RR, SS, TT, UU, VV, WW, and XX of steps of the process to fabricate the semiconductor packages of FIG. 19 in examples of the present disclosure.

FIG. 28 shows a side view of a film between a chase and a semiconductor device in examples of the present disclosure.

DETAILED DESCRIPTION OF THE INVENTION

Figure 1:
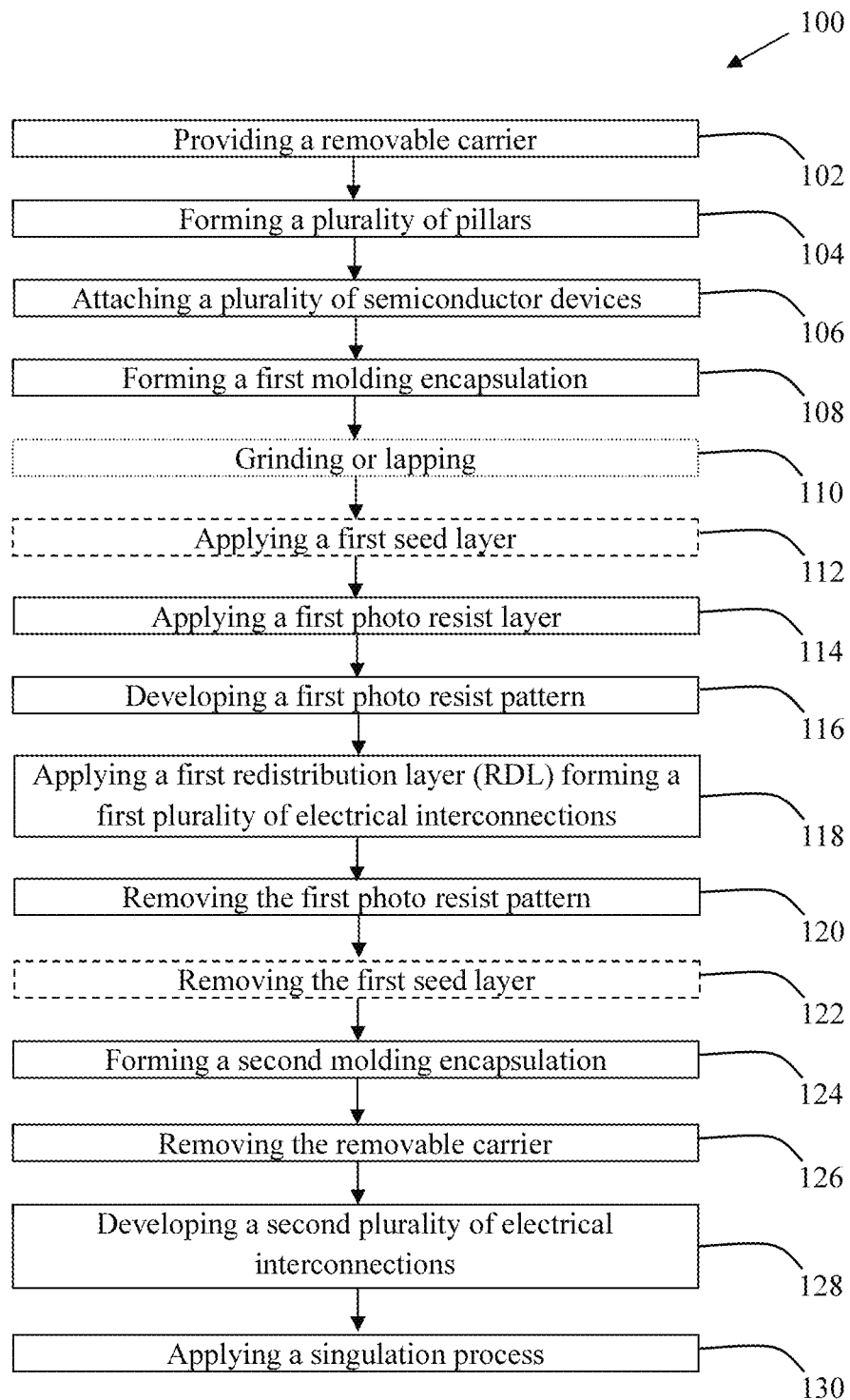
FIG. 1 is a flowchart of a process to fabricate semiconductor packages in examples of the present disclosure.

FIG. 1 is a flowchart of a process 100 to fabricate semiconductor packages in examples of the present disclosure. The process 100 may start from block 102.

In block 102, a removable carrier 310 of FIGS. 3A and 3B is provided. In one example, the removable carrier 310 is used in the process to fabricate a single semiconductor package (the left one in solid lines of FIGS. 3A and 3B). In another example, the removable carrier 310 is used in the process to fabricate two or more semiconductor packages (for example, the left one in solid lines of FIGS. 3A and 3B and the right one in dashed lines of FIGS. 3A and 3B). For simplicity, the right one in dashed lines (same structure as the corresponding left one in solid lines) is not shown in FIGS. 4A, 5A, 6A, 7A, 8A, 9A, 10A, 11A, 12A, 13A, 14A, 15A, 16A, and 17A and FIGS. 4B, 5B, 6B, 7B, 8B, 9B, 10B, 11B, 12B, 13B, 14B, 15B, 16B, and 17B. In one example, the removable carrier 310 is made of a stainless material. Block 102 may be followed by block 104.

In block 104, a plurality of pillars 320 of FIGS. 3A and 3B are formed on a top surface 312 of the removable carrier 310. In examples of the present disclosure, the plurality of pillars 320 are made of a copper material disposed on the top surface 312 of the removable carrier 310 surrounding an area of exposed top surface 312 for the semiconductor chips to be mounted. The plurality of pillars 320 preferably has a height substantially the same or slightly higher than the thickness of the semiconductor devices. In one example, a height of the plurality of pillars 320 is 100 microns or more and a thickness of the semiconductor devices is 100 microns or more. Block 104 may be followed by block 106.

Figure 4A:
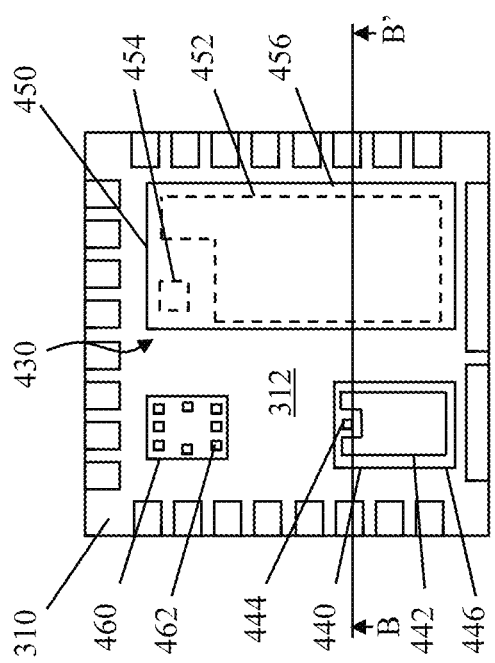
Figure 4B:
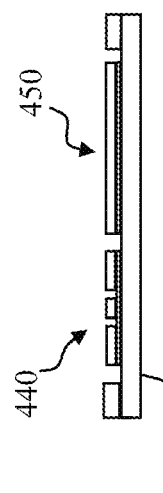

In block 106, a plurality of semiconductor devices 430 of FIGS. 4A and 4B are attached to the top surface 312 of the removable carrier 310 by a die attaching adhesive. In examples of the present disclosure, the plurality of semiconductor devices 430 includes a first metal-oxide semiconductor field-effect transistors (MOSFET) 440, a second MOSFET 450, and an integrated circuit (IC) 460. In examples of the present disclosure, the first MOSFET 440, the second MOSFET 450, and the IC 460 are of rectangular prism shapes. A top surface of the first MOSFET 440, a top surface of the second MOSFET 450, and a top surface of the IC 460 are parallel to the top surface 312 of the removable carrier 310. In examples of the present disclosure, the first MOSFET 440 has a source electrode 442 and a gate electrode 444 that may be formed of a copper layer on a top surface of the first MOSFET 440 and a drain electrode 446 that may be formed of a copper layer on a bottom surface of the first MOSFET 440. In examples of the present disclosure, the second MOSFET 450 is flipped. The second MOSFET 450 has a source electrode 452 that may be formed of a copper layer and a gate electrode 454 that may be formed of a copper layer on a bottom surface of the second MOSFET 450 and a drain electrode 456 that may be formed of a copper layer on a top surface of the second MOSFET 450. In examples of the present disclosure, the IC 460 has a plurality of bond pads 462 that may be formed of a copper layer on a top surface of the IC 460. No die paddle is used for die attachments as the copper layer forming semiconductor chip electrodes of each semiconductor device is attached by a die attaching adhesive to the exposed top surface 312 of the removable carrier 310 surrounded by the plurality of pillars 320. Preferably, the copper layer forming top or bottom surface electrodes of each semiconductor device is between 20 to 50 microns. Block 106 may be followed by block 108.

Figure 5A:
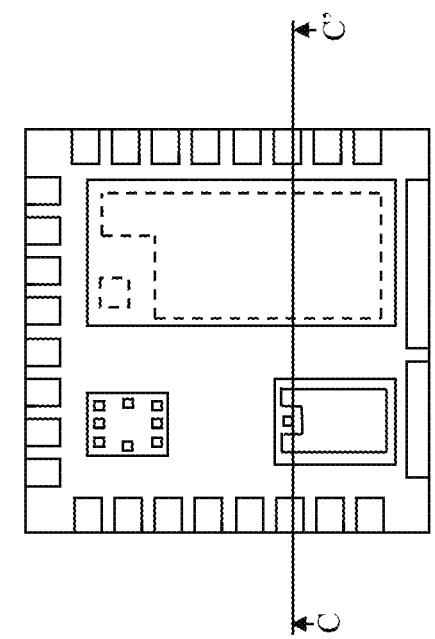
Figure 5B:
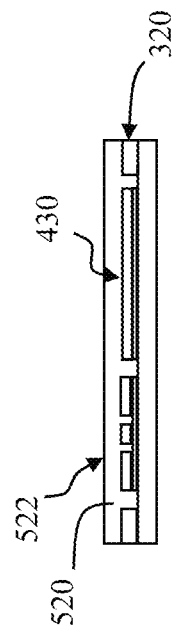

In block 108, a first molding encapsulation 520 of FIGS. 5A and 5B is formed. In examples of the present disclosure, the first molding encapsulation 520 is shown as transparent. The first molding encapsulation 520 encloses a majority portion of the plurality of pillars 320 and a majority portion of the plurality of semiconductor devices 430. The first molding encapsulation 520 may have a height slightly larger than the thickness of the semiconductor chips such that a grinding or lapping process is required to expose the covered electrodes and top surface of the pillars. Block 108 may be followed by block 110. Alternatively, the first molding encapsulation 520 may have a height substantially the thickness of the semiconductor devices such that top surfaces of each device electrode and top surface of the pillars are exposed. In this case the step in block 110 may be skipped.

In block 110, a grinding or a lapping process is applied to a top surface 522 of FIGS. 5A and 5B of the first molding encapsulation 520 so as to form an exposed surface 622 of FIGS. 6A and 6B of a machined first molding encapsulation 620. A plurality of electrodes 630 of the plurality of semiconductor devices 430 are exposed from the exposed surface 622 of the machined first molding encapsulation 620. Block 110 may be followed by block 112.

In block 112, a first seed layer 760 of FIGS. 7A and 7B is applied to the exposed surface 622 of the machined first molding encapsulation 620. In examples of the present disclosure, the first seed layer 760 is made of a conductive material. In examples of the present disclosure, the block 112 may be skipped (shown in dashed lines) in case the exposed plurality of electrodes 630 are formed of copper. Block 112 may be followed by block 114.

In block 114, a first photo resist layer 880 of FIGS. 8A and 8B is applied above the exposed surface 622 of the machined first molding encapsulation 620. In one example, the first seed layer 760 of FIGS. 7A and 7B is applied, the first photo resist layer 880 is directly attached to the first seed layer 760. In another example, the first seed layer 760 of FIGS. 7A and 7B is not applied, the first photo resist layer 880 is directly attached to the exposed surface 622 of the machined first molding encapsulation 620. Block 114 may be followed by block 116.

In block 116, a first photo resist pattern 990 of FIGS. 9A and 9B is developed using a first patterned mask under a first exposure process. Block 116 may be followed by block 118.

Figure 10A:
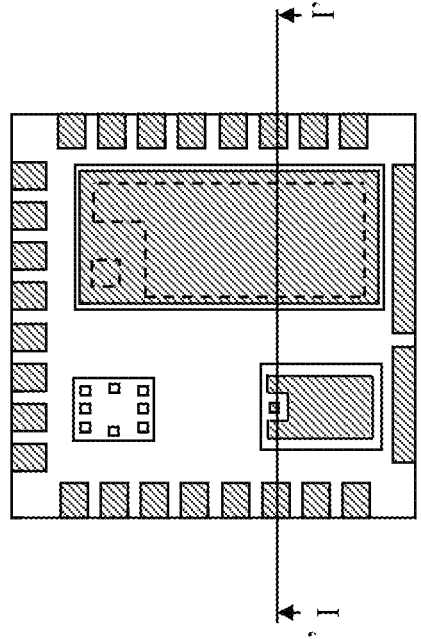
Figure 10B:
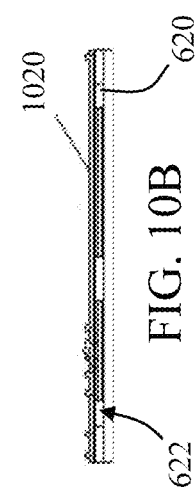

In block 118, a first redistribution layer (RDL) 1020 of FIGS. 10A and 10B is applied above the exposed surface 622 of the first molding encapsulation 620 so as to form a first plurality of electrical interconnections. Block 118 may be followed by block 120.

Figure 11A:
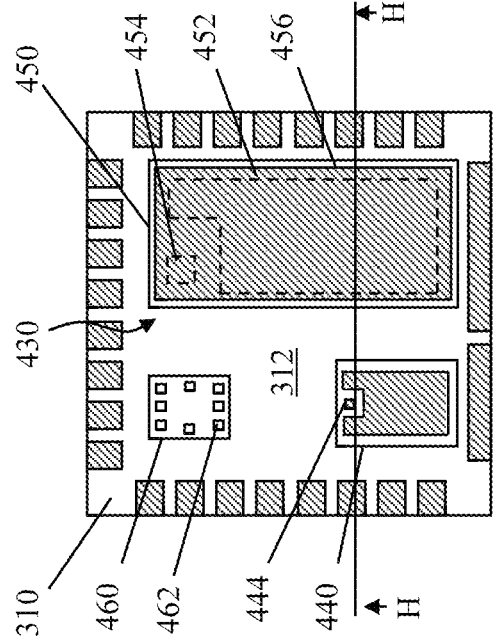
Figure 11B:
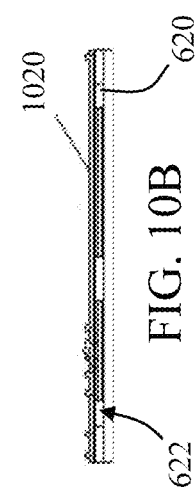

In block 120, the first photo resist pattern 990 of FIGS. 9A and 9B is removed (by stripping) leaving spaces 1140 of FIGS. 11A and 11B. Block 120 may be followed by block 122.

In block 122, in one example, the first seed layer 760 of FIGS. 7A and 7B is applied, the first seed layer 760 is etched away in the present step. In another example, the first seed layer 760 of FIGS. 7A and 7B is not applied, there is no seed layer to be etched away in the present step. Therefore, block 122 is an optional step shown in dashed lines. Block 122 may be followed by block 124.

Figure 12A:
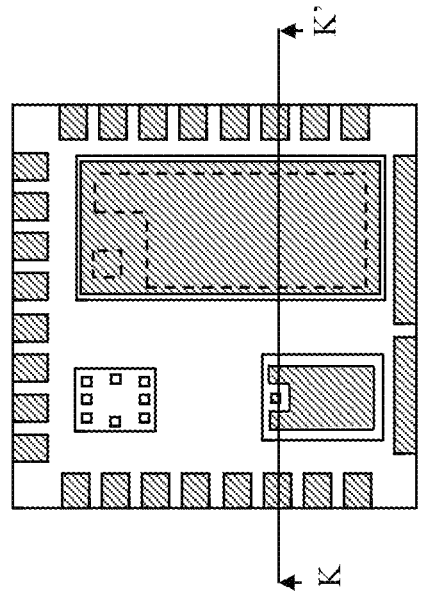
Figure 12B:
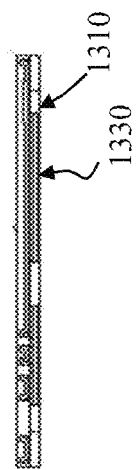

In block 124, a second molding encapsulation 1220 of FIGS. 12A and 12B is formed. In examples of the present disclosure, the second molding encapsulation 1220 is shown as transparent. The second molding encapsulation 1220 encloses a first plurality of electrical interconnections 1240 and all other the top surface electrodes. The electrical interconnections 1240 connects each of the top surface electrodes on a semiconductor devices to a pillar or to another top surface electrode of a different semiconductor devices (not shown). Block 124 may be followed by block 126.

Figure 13A:
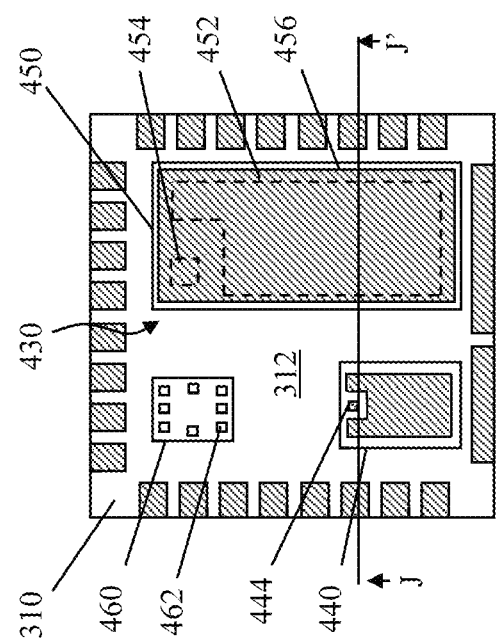
Figure 13B:
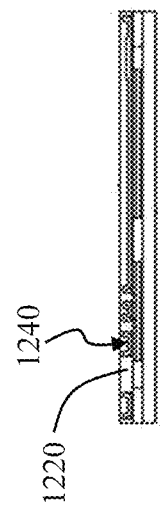

In block 126, the removable carrier 310 of FIGS. 3A and 3B is removed leaving an exposed bottom surface 1310 of FIGS. 13A and 13B. Block 126 may be followed by block 128.

In block 128, a second plurality of electrical interconnections 1840 of FIGS. 18A and 18B are developed under the exposed bottom surface 1310 of FIGS. 13A and 13B (also under the plurality of semiconductor devices 430 of FIGS. 4A and 4B). Block 128 is described in detail in FIG. 2. Block 128 may be followed by block 130.

In block 130, a singulation process along plane 1898 of FIGS. 18A and 18B is applied. The semiconductor packages 1800 are formed after the singulation process. The package in solid lines is separated from the package in dashed lines.

Figure 2:
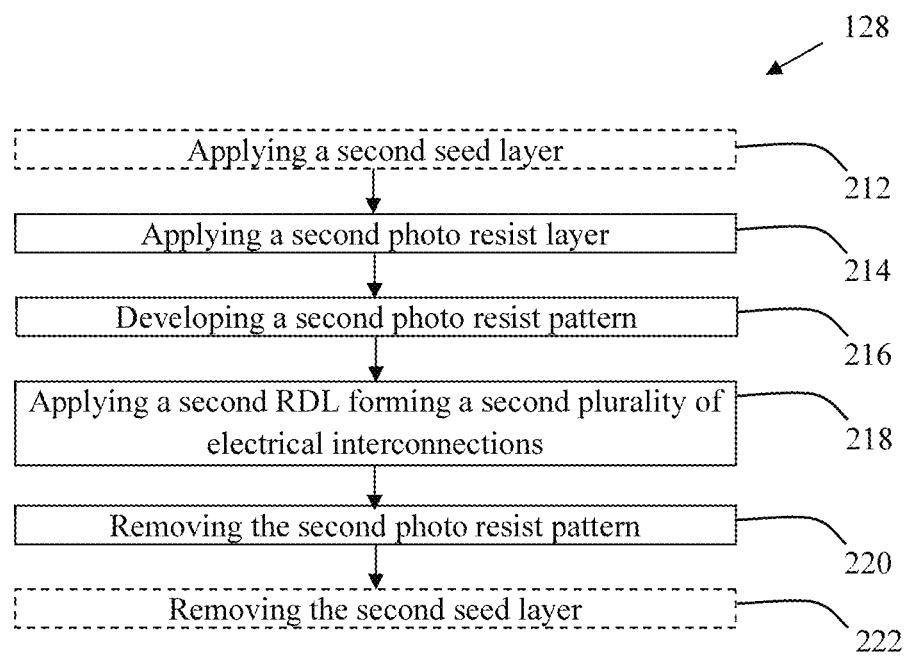
FIG. 2 is a flowchart of a process to develop a plurality of electrical connections in examples of the present disclosure.

FIG. 2 is a flowchart of a process (block 128) to develop a plurality of electrical connections in examples of the present disclosure. The sub-steps of the process (block 128) may start from block 212.

Figure 14A:
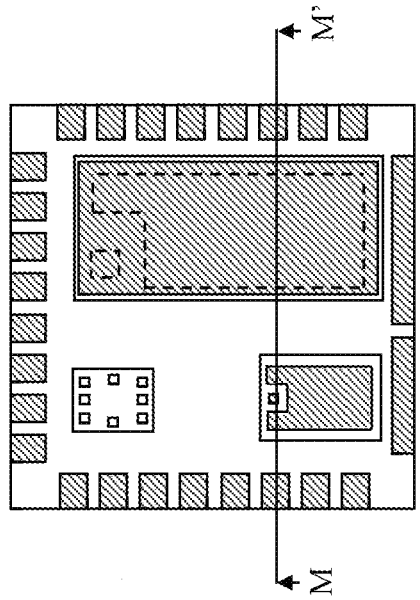
Figure 14B:
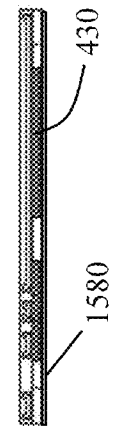

In block 212, a second seed layer 1460 of FIGS. 14A and 14B is applied to the exposed bottom surface 1310 of FIGS. 13A and 13B. In examples of the present disclosure, the second seed layer 1460 is made of a conductive material. In examples of the present disclosure, the block 212 is optional (shown in dashed lines) because of the existence of the exposed plurality of electrodes 1330 of FIGS. 13A and 13B. Block 212 may be followed by block 214.

Figure 15A:
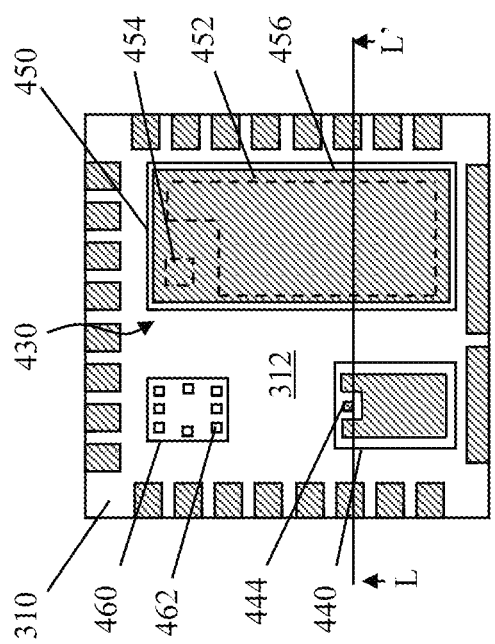
Figure 15B:
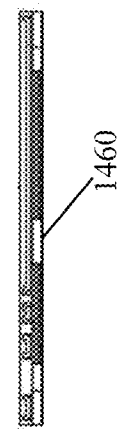

In block 214, a second photo resist layer 1580 of FIGS. 15A and 15B is applied under the plurality of semiconductor devices 430 of FIGS. 4A and 4B. In one example, the second seed layer 1460 of FIGS. 14A and 14B is applied, the second photo resist layer 1580 is directly attached to the second seed layer 1460. In another example, the second seed layer 1460 of FIGS. 14A and 14B is not applied, the second photo resist layer 1580 is directly attached to exposed bottom surface 1310 of FIGS. 13A and 13B. Block 214 may be followed by block 216.

Figure 16A:
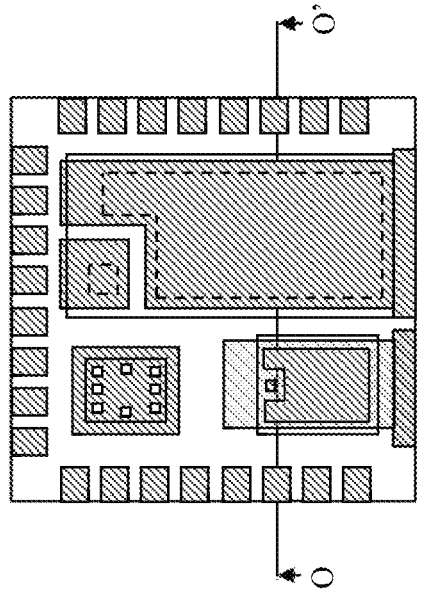
Figure 16B:
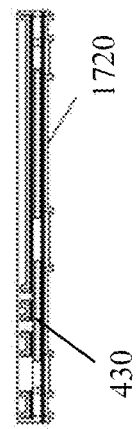

In block 216, a second photo resist pattern 1690 of FIGS. 16A and 16B is developed using a second patterned mask under a second exposure process. Block 216 may be followed by block 218.

Figure 17A:
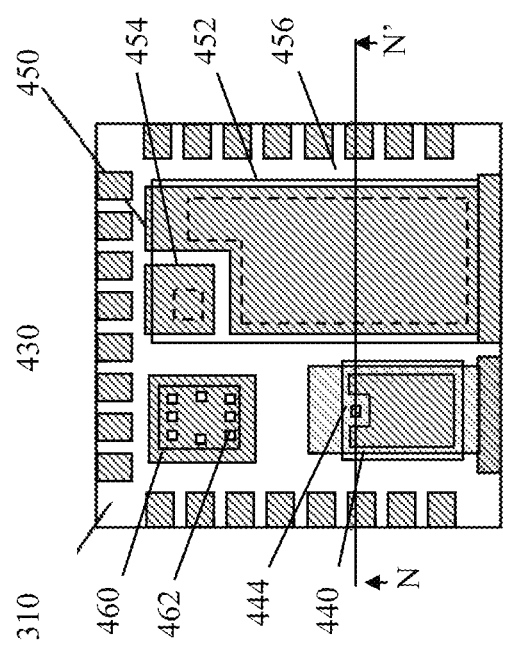
Figure 17B:

In block 218, a second RDL 1720 of FIGS. 17A and 17B is applied under the plurality of semiconductor devices 430 of FIGS. 4A and 4B. Block 218 may be followed by block 220.

In block 220, the second photo resist pattern 1690 of FIGS. 16A and 16B is removed (by stripping) leaving spaces 1841 of FIGS. 18A and 18B. Block 220 may be followed by block 222.

In block 122, in one example, the second seed layer 1460 of FIGS. 14A and 14B is applied, the second seed layer 1460 is etched away in the present step. In another example, the second seed layer 1460 of FIGS. 14A and 14B is not applied, there is no seed layer to be etched away in the present step. Therefore, block 222 is an optional step shown in dashed lines.

FIGS. 18A and 18B show a semiconductor package 1800 (in solid lines) in examples of the present disclosure. The semiconductor package 1800 includes a plurality of pillars 320, a plurality of semiconductor devices 430, a first molding encapsulation 620, a first plurality of electrical interconnections 1240 on the top surface of the first molding encapsulation 620, a second molding encapsulation 1220 overlaying the first plurality of electrical interconnections 1240 on the top surface of the first molding encapsulation 620, and a second plurality of electrical interconnections 1840 disposed on a bottom surface of the first molding encapsulation 620. The first molding encapsulation 620 encloses a majority portion of the plurality of pillars 320 and a majority portion of the plurality of semiconductor devices 430. The first plurality of electrical interconnections 1240 electrically connect the plurality of pillars 320 to the plurality of semiconductor devices 430 or the electrodes on top surfaces between different semiconductor devices. The second molding encapsulation 1220 encloses the first plurality of electrical interconnections 1240. The second plurality of electrical interconnections 1840 on the bottom surface electrically connect the plurality of pillars 320 to the plurality of semiconductor devices 430. Bottom surfaces of the plurality of pillars 320 and bottom electrodes of the semiconductor devices are exposed from the bottom surface of the first molding encapsulation 620. A bottom surface of the second molding encapsulation 1220 is directly attached to a top surface of the first molding encapsulation 620.

In examples of the present disclosure, an entirety of the first plurality of electrical interconnections 1240 is embedded in the second molding encapsulation 1220. An entirety of the second plurality of electrical interconnections 1840 is exposed under the first molding encapsulation 620.

In examples of the present disclosure, the first molding encapsulation 620 and the second molding encapsulation 1220 are made of a same material. In examples of the present disclosure, the first molding encapsulation 620 and the second molding encapsulation 1220 are made of different materials. In examples of the present disclosure, a hardness of the first molding encapsulation 620 is larger than a hardness of the second molding encapsulation 1220 because the first molding encapsulation 620 went through a grinding or a lapping process (see block 110). In examples of the present disclosure, the first molding encapsulation 620 comprises a first percentage of glass filling (for example, 50% glass filling). The second molding encapsulation 1220 comprises a second percentage of glass filling (for example, 25% glass filling). The first percentage of glass filling is larger than the second percentage of glass filling (50% is larger than 25%).

In examples of the present disclosure, the plurality of semiconductor devices comprise an integrated circuit (IC) 460, a first metal-oxide semiconductor field-effect transistors (MOSFET) 440, and a second MOSFET 450. The first MOSFET 440 comprises a small area gate electrode 444 and a large area source electrode 442 on a top surface of the first MOSFET 440, a large area drain electrode 446 extends over substantially an entire bottom surface of the first MOSFET 440. The second MOSFET 450 comprises a small area gate electrode 454 and a large area source electrode 452 on a bottom surface of the second MOSFET 450, a large area drain electrode 456 extends over substantially an entire top surface of the second MOSFET 450. One of the first plurality of electrical interconnections 1240 interconnecting the drain electrode 446 on the top surface of the first MOSFET 440 and the source electrode 452 on the top surface of the second MOSFET 450. The process of plating copper on the top surface of the first molding encapsulation 620 to form the electrical interconnections 1240 also increases the copper thickness of the top surface electrodes of the first MOSFET 440 and the second MOSFET 450 by about the same amount. Therefore while the copper layer thickness of the electrical interconnections 1240 on the top surface of the first molding encapsulation 620 is 20 to 50 microns, the overall copper layer thickness on the top surface of the first MOSFET 440 and the top surface of the second MOSFET 450 ranges from 40 to 100 microns. Preferably, the copper thickness on the top surface of the first MOSFET 440 and the top surface of the second MOSFET 450 is not more than twice the copper thickness of the electrical interconnections 1240 on the top surface of the first molding encapsulation 620. For the same reason, while the copper layer thickness of the electrical interconnections 1840 on the bottom surface of the first molding encapsulation 620 is 20 to 50 microns, the overall copper layer thickness on the bottom surface of the first MOSFET 440 and the bottom surface of the second MOSFET 450 ranges from 40 to 100 microns. Preferably, the copper thickness on the bottom surface of the first MOSFET 440 and the bottom surface of the second MOSFET 450 is not more than twice the copper thickness of the electrical interconnections 1820 on the bottom surface of the first molding encapsulation 620.

In examples of the present disclosure, the semiconductor package 1800 excludes a wire (for example, wires of FIG. 6A of U.S. Pat. No. 9,754,864). The semiconductor package 1800 excludes a clip (for example, clips of FIG. 6B of U.S. Pat. No. 9,754,864). No die paddle is used for die bonding therefore the bottom plated copper electrodes are exposed through the bottom surface of encapsulation.

Figure 19:
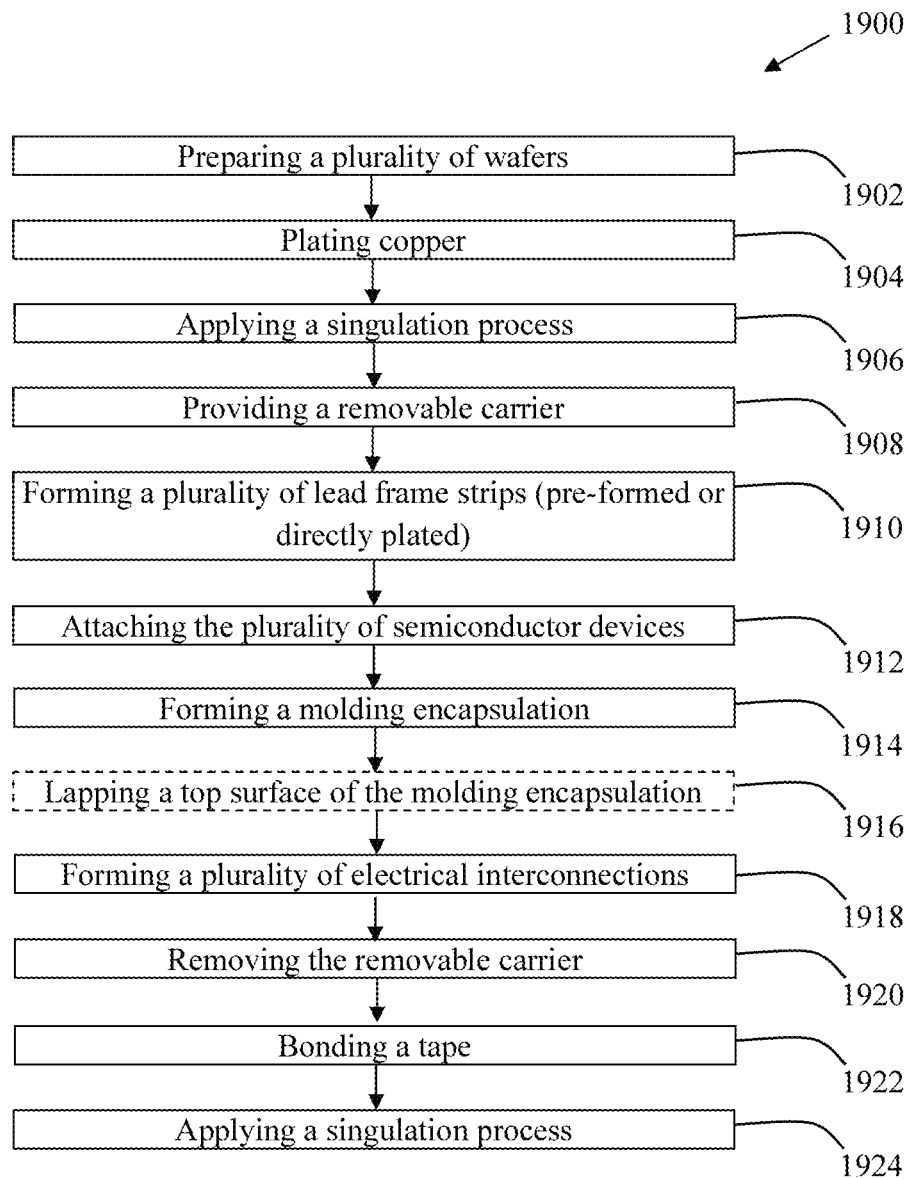
FIG. 19 is a flowchart of another process to fabricate semiconductor packages in examples of the present disclosure.

FIG. 19 is a flowchart of a process 1900 to fabricate semiconductor packages in examples of the present disclosure. The process 1900 may start from block 1902.

Figure 20A:
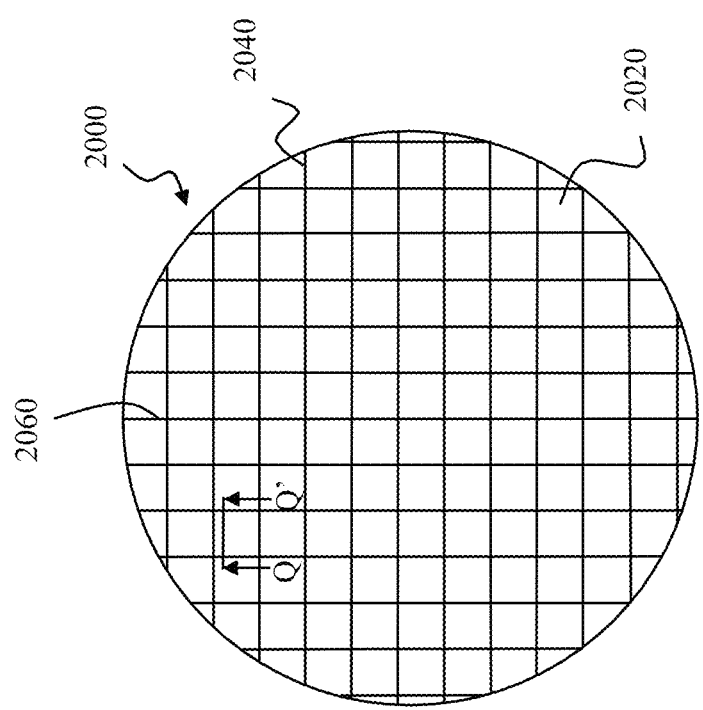

In block 1902, a plurality of wafers 2000 of FIG. 20A are prepared. The plurality of wafers 2000 contain a plurality of semiconductor devices 2020. In examples of the present disclosure, a first wafer contains a plurality of metal-oxide semiconductor field-effect transistors (MOSFETs). A second wafer contains a plurality of integrated circuits (ICs). Block 1902 may be followed by block 1904.

Figure 20B:
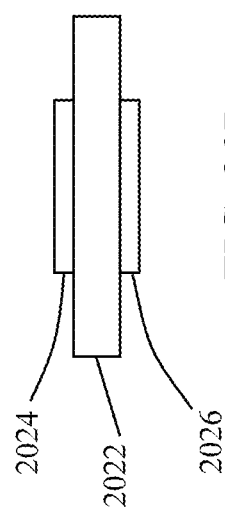

In block 1904, copper is plated on a plurality of top surfaces and a plurality of bottom surfaces of the plurality of wafers 2000. A selected semiconductor device 2022 of FIG. 20B (cross sectional view along QQ of FIG. 20A) comprises a top plated copper 2024 and a bottom plated copper 2026 disposed over each metal contact to form electrodes. In examples of the present disclosure, a thickness of the top plated copper 2024 is in a range from 20 microns to 50 microns. In examples of the present disclosure, a thickness of the bottom plated copper 2026 is in a range from 20 microns to 50 microns. Block 1904 may be followed by block 1906.

In block 1906, a singulation process along a plurality of horizontal lines 2040 and a plurality of vertical lines 2060 is applied to the plurality of wafers 2000 of FIG. 20A forming a plurality of separated semiconductor devices 2230 of FIGS. 22A and 22B. As an option, the plurality of separated semiconductor devices 2230 may be protected with a pre-molding layer before or after the singulation process. Block 1906 may be followed by block 1908.

In block 1908, a removable carrier 2110 of FIGS. 21A and 21B is provided. In one example, the removable carrier 2110 is made of a stainless material. Block 1908 may be followed by block 1910.

In block 1910, a plurality of lead strips 2120 of FIGS. 21A and 21B are formed on a top surface 2112 of the removable carrier 2110. In examples of the present disclosure, no die paddles are used. In examples of the present disclosure, the plurality of lead strips 2120 are made of a copper material having a predetermined width disposed on the removable carrier 2110 at a predetermined repeated space. In examples of the present disclosure, each of the plurality of lead strips 2120 comprises a plurality of horizontal bars that may be connected by vertical bars on both ends to form groups of leads. A long vertical bar 2129 running through the centers of the plurality of horizontal bars divides each of the lead strips 2120 into a first lead strip portion 2125 on the left and a second lead strip portion 2127 on the right. Each group of leads includes one or more horizontal bars connected at one end with different groups not connected at the same end. As shown in FIG. 21B, the first lead strip portion 2125 includes two groups of leads with only the bottom horizontal bar 2125A not connected to the other horizontal bars at the left end while the second lead strip portion 2127 includes only one group of leads since all the horizontal bars connected at the right ends. In one example, copper is directly plated on the top surface 2112 of the removable carrier 2110 to a height at least the thickness of the semiconductor chips to be disposed on the removable carrier 2110 so as to form the plurality of lead strips 2120. In another example, a plurality of pre-formed copper strips is bonded to the top surface 2112 of the removable carrier 2110 so as to form the plurality of lead strips 2120. Block 1910 may be followed by block 1912.

In block 1912, a plurality of sets of separated semiconductor devices 2230 of FIGS. 22A and 22B are attached to the top surface 2112 of the removable carrier 2110 within the repeated spaces separated by the lead strips 2120, each set of the separated semiconductor devices 2230 occupied one of the repeated spaces. In examples of the present disclosure, a set of separated semiconductor devices 2230 comprises a first metal-oxide semiconductor field-effect transistors (MOSFET) 2240 and a second MOSFET 2250. In examples of the present disclosure, the first MOSFET 2240 and the second MOSFET 2250 are of rectangular prism shapes. A top surface of the first MOSFET 2240 and a top surface of the second MOSFET 2250 are parallel to the top surface 2112 of the removable carrier 2110. In examples of the present disclosure, the first MOSFET 2240 is a low side (LS) MOSFET. The first MOSFET 2240 is flipped. The first MOSFET 2240 has a source electrode 2242 and a gate electrode 2244 on a bottom surface of the first MOSFET 2240 and a drain electrode 2246 on a top surface of the first MOSFET 2240. In examples of the present disclosure, the second MOSFET 2250 is a high side (HS) MOSFET. The second MOSFET 2250 has a source electrode 2252 and a gate electrode 2254 on a top surface of the second MOSFET 2250 and a drain electrode 2256 on a bottom surface of the second MOSFET 2250. Each top or bottom surface electrode is made of the top plated copper 2024 or the bottom plated copper 2026 respectively. Block 1912 may be followed by block 1914.

Figure 23A:
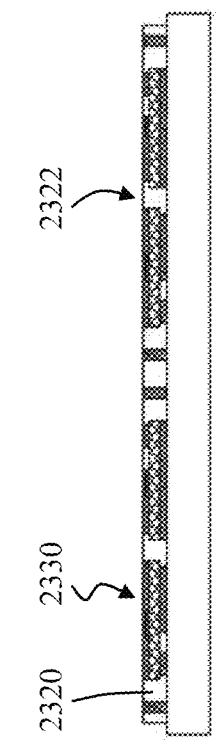
Figure 23B:
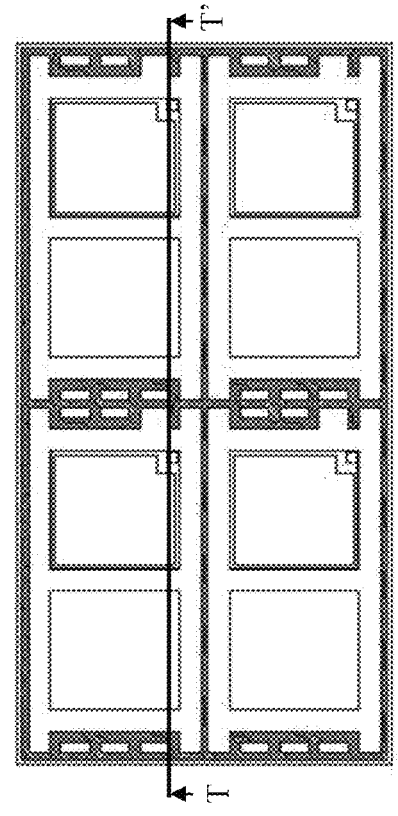

In block 1914, a molding encapsulation 2320 of FIGS. 23A and 23B is formed. In examples of the present disclosure, the molding encapsulation 2320 is shown as transparent. The molding encapsulation 2320 encloses a majority portion of the plurality of lead strips 2120 and the plurality of separated semiconductor devices 2230.

In examples of the present disclosure, block 1914 comprises the sub-step of applying a removable film 2832 of FIG. 28 between a chase 2834 of a molding tool and the plurality of separated semiconductor devices 2230 to protect the surface electrodes from the molding material such that the surface electrodes will exposed after the molding process. Alternatively an over molding layer may be formed covering the entirety of the plurality of separated semiconductor devices 2230. Block 1914 may be followed by block 1916.

In block 1916, an optional lapping process (shown in dashed lines) is applied to a top surface 2322 of FIGS. 23A and 23B of the molding encapsulation 2320. In examples of the present disclosure, a lapping process removes a thickness of molding encapsulation in a range from 1 micron to 3 microns while a grinding process removes a thickness of molding encapsulation in a range from 10 microns to 20 microns.

A plurality of electrodes 2330 of the plurality of separated semiconductor devices 2230 and the lead strips 2120 are exposed from the top surface 2322 of the molding encapsulation 2320. Block 1916 may be followed by block 1918.

Figure 24A:
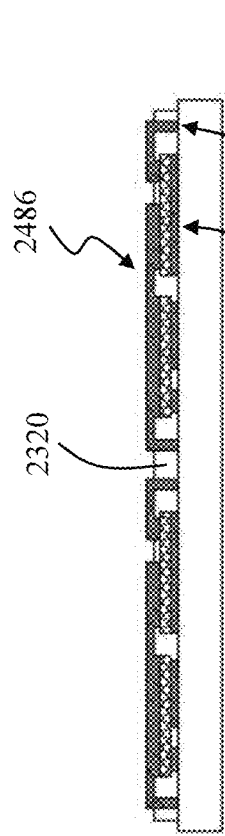
Figure 24B:
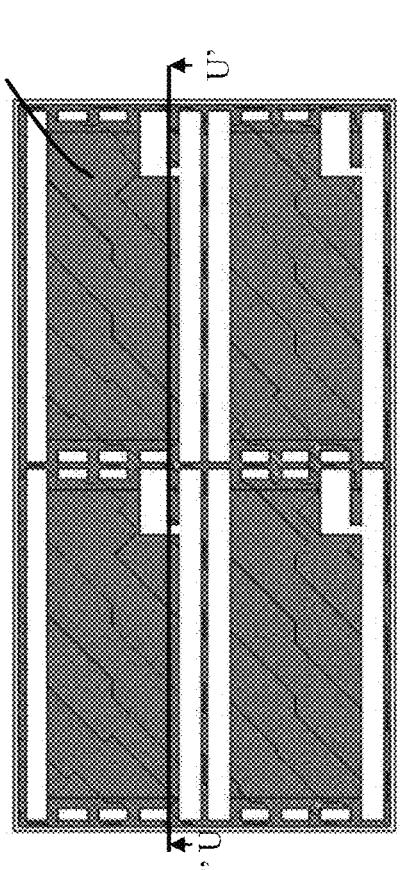

In block 1918, a plurality of electrical interconnections 2486 of FIGS. 24A and 24B are formed by plating a copper layer of 20 to 50 microns on a top surface of the molding encapsulation 2320. The plurality of electrical interconnections 2486 connect the top surface electrodes of the plurality of separated semiconductor devices 2230 to the lead strips 2120 surrounding the plurality of separated semiconductor devices 2230, as well as interconnect the electrodes on the top surfaces of different devices. Specifically, the drain electrode 2246 on the top surface of the first MOSFET 2240 and the source electrode 2252 on the top surface of the second MOSFET 2250 are interconnected and connected to one or more lead groups within the adjacent lead strips 2120, the gate electrode 2254 on the top surface of the second MOSFET 2250 is connected to another lead group in an adjacent lead strip 2120. As shown, one of the electrical interconnections 2486 interconnecting the drain electrode 2246 on the top surface of the first MOSFET 2240 and the source electrode 2252 on the top surface of the second MOSFET 2250 extends over substantially an entire top surface of the molding encapsulation 2320 between adjacent lead strips 2120 except a separation from the gate electrode 2254 on the top surface of the second MOSFET 2250 connected to the bottom horizontal bar 2125A of an adjacent lead strip. The process of plating copper on the top surface of the molding encapsulation 2320 to form the electrical interconnections 2486 also increases the copper thickness of the top surface electrodes of the separated semiconductor devices 2230 by about the same amount. Therefore while the copper layer thickness of the electrical interconnections 2486 on the top surface of the molding encapsulation 2320 is 20 to 50 microns, the overall copper layer thickness on the top surface of the first MOSFET 2240 and the top surface of the second MOSFET 2250 ranges from 40 to 100 microns. Preferably, the copper thickness on the top surface of the first MOSFET 2240 and the top surface of the second MOSFET 2250 is about twice the copper thickness of the electrical interconnections 2486 on the top surface of the molding encapsulation 2320. The bottom plated copper 2026 disposed over each metal contact to form bottom electrodes on the bottom surface of the first MOSFET 2240 and on the bottom surface of the second MOSFET 2250 does not change its thickness therefore maintains 20 to 50 microns. Preferably, the copper thickness on the bottom surface of the first MOSFET 2240 and the bottom surface of the second MOSFET 2250 is about the same of the copper thickness of the electrical interconnections 2486 on the top surface of the molding encapsulation 2320. Block 1918 may be followed by block 1920.

In block 1920, the removable carrier 2110 of FIGS. 21A and 21B is removed leaving an exposed bottom surface 2510 of FIGS. 25A and 25B. Bottom surfaces of the source electrode 2242 and the gate electrode 2244 on the bottom of the first MOSFET 2240 and a bottom surface of the drain electrode 2256 on the bottom of the second MOSFET 2250 are exposed from a bottom surface of the molding encapsulation 2320, bottom surfaces of the plurality of the lead strips are also exposed from the bottom surface of the molding encapsulation 2320. Block 1920 may be followed by block 1922.

In block 1922, a tape 2694 of FIGS. 26A and 26B is bonded to the exposed bottom surface 2510. In examples of the present disclosure, the tape 2694 is made of a polyimide material. Block 1922 may be followed by block 1924.

In block 1924, a singulation process along horizontal lines 2752 and vertical lines 2754 of FIGS. 27A and 27B is applied. The semiconductor packages 2700, 2702, 2704 and 2706 are formed after the singulation process. After applying the singulation process, the first lead strip portion 2125 of FIG. 27B of one of the plurality of lead strips 2120 and the second lead strip portion 2127 of the one of the plurality of lead strips 2120 are electrically isolated and separated into two different semiconductor packages and the long vertical bar 2129 of FIG. 21B is removed during the singulation process. Therefore each group of leads is connected at one end of the horizontal bars.

FIGS. 27A and 27B show a semiconductor package 2700 in examples of the present disclosure before removed from the dicing tap 2694. The semiconductor package 2700 includes a first lead strip portion 2125 on a first side and a second lead strip portion 2127 on a second side of the package, a plurality of separated semiconductor devices 2230 enclosed in a molding encapsulation 2320, a first plurality of copper pads 2792 exposed from a bottom surface of the molding encapsulation 2320, including the bottom electrodes of the plurality of separated semiconductor devices 2230 and bottom surface of the first lead strip portion 2125 and the second lead strip portion 2127, a second plurality of copper pads 2794 exposed from a top surface of the molding encapsulation 2320, including the top surface electrodes of the plurality of separated semiconductor devices 2230 and top surface of the first lead strip portion 2125 and the second lead strip portion 2127, and a plurality of electrical interconnections 2486 on the top surface of the molding encapsulation 2320. The molding encapsulation 2320 encloses a majority portion of the first lead strip portion 2125 and the second lead strip portion 2127 and the plurality of separated semiconductor devices 2230. The plurality of electrical interconnections 2486 connect the plurality of separated semiconductor devices 2230 to a plurality of lead groups of the first lead strip portion 2125 and second lead strip portion 2127 through the second plurality of copper pads 2794.

In examples of the present disclosure, an entirety of plurality of electrical interconnections 2486 is above the molding encapsulation 2320.

In examples of the present disclosure, the plurality of semiconductor devices comprise a first metal-oxide semiconductor field-effect transistors (MOSFET) 2240, and a second MOSFET 2250. The first MOSFET 2240 is a low side (LS) MOSFET. The first MOSFET 2240 is flipped. The first MOSFET 2240 has a source electrode 2242 and a gate electrode 2244 on a bottom surface of the first MOSFET 2240 and a drain electrode 2246 on a top surface of the first MOSFET 2240. In examples of the present disclosure, the second MOSFET 2250 is a high side (HS) MOSFET. The second MOSFET 2250 has a source electrode 2252 and a gate electrode 2254 on a top surface of the second MOSFET 2250 and a drain electrode 2256 on a bottom surface of the second MOSFET 2250.

In examples of the present disclosure, the drain electrode 2256 of the second MOSFET 2250, the source electrode 2242 of the first MOSFET 2240, and a first predetermined portion 2191 of the first lead strip portion 2125 and or second lead strip portion 2127 are connected through a first portion 2181 of plurality of electrical interconnections 2486 above the molding encapsulation 2320; and wherein a gate electrode of the second MOSFET is connected to a second predetermined portion 2193 (2125A) of the first lead strip portion 2125 through a second portion 2183 of plurality of electrical interconnections 2486 above the molding encapsulation 2320.

In examples of the present disclosure, the semiconductor package 2700 excludes a wire (for example, wires of FIG. 6A of U.S. Pat. No. 9,754,864). The semiconductor package 2700 excludes a clip (for example, clips of FIG. 6B of U.S. Pat. No. 9,754,864). No die paddle is used for die bonding therefore the bottom plated copper electrodes are exposed through the bottom surface of encapsulation.

Those of ordinary skill in the art may recognize that modifications of the embodiments disclosed herein are possible. For example, a total number of semiconductor devices in a semiconductor package may vary. Other modifications may occur to those of ordinary skill in this art, and all such modifications are deemed to fall within the purview of the present invention, as defined by the claims.

The invention claimed is:

1. A method for fabricating semiconductor packages, the method comprising the steps of:
providing a removable carrier;
forming a plurality of pillars on a top surface of the removable carrier;
attaching a plurality of semiconductor devices to the top surface of the removable carrier;
forming a first molding encapsulation enclosing a majority portion of the plurality of pillars and a majority portion of the plurality of semiconductor devices so that top surfaces of the plurality of pillars and top surface electrodes of the plurality of semiconductor devices are exposed from a top surface of the first molding encapsulation;
applying a first photo resist layer over the top surface of the first molding encapsulation;
developing a first photo resist pattern using a first patterned mask under a first exposure process;
applying a first redistribution layer (RDL) over an exposed top surface of the first molding encapsulation and the top surface electrodes of the plurality of semiconductor devices forming a first plurality of electrical interconnections;

removing the first photo resist pattern;

forming a second molding encapsulation enclosing the first plurality of electrical interconnections;

removing the removable carrier;

applying a second photo resist layer over a bottom surface of the first molding encapsulation and the plurality of semiconductor devices;

developing a second photo resist pattern using a second patterned mask under a second exposure process;

applying a second RDL over an exposed bottom surface of the first molding encapsulation and the plurality of semiconductor devices forming a second plurality of electrical interconnections;

removing the second photo resist pattern; and applying a singulation process forming the semiconductor packages;

wherein a bottom surface of the second molding encapsulation is directly attached to the top surface of the first molding encapsulation in a region directly between one pillar of the plurality of pillars and one semiconductor device of the plurality of semiconductor devices; and wherein the one pillar of the plurality of pillars and the one semiconductor device of the plurality of semiconductor devices are contained in a same semiconductor package of the semiconductor packages.

2. The method for fabricating semiconductor packages of claim 1, wherein the removable carrier is made of a stainless steel material; and wherein the plurality of pillars are made of a copper material.

3. The method for fabricating semiconductor packages of claim 2, wherein the plurality of semiconductor devices comprise:
  a plurality of integrated circuits (ICs);
  a plurality of first metal-oxide semiconductor field-effect transistors (MOSFETs); and
  a plurality of second MOSFETs.

4. The method for fabricating semiconductor packages of claim 3, wherein each of the first plurality of MOSFETs comprises a gate electrode and a source electrode on a top surface of said each MOSFET of the first plurality of MOSFETs; and
  wherein each of the second plurality of MOSFETs comprises a gate electrode and a source electrode on a bottom surface of said each MOSFET of the second plurality of MOSFETs.

5. The method for fabricating semiconductor packages of claim 1, wherein the step of forming the first molding encapsulation further comprising forming a first over molding encapsulation followed by a step of grinding or lapping a top portion of the first molding encapsulation.

6. The method for fabricating semiconductor packages of claim 1 further comprising
  applying a first seed layer to the top surface of the first molding encapsulation; and
after the step of removing the first photo resist pattern, further comprising
  removing the first seed layer.

7. The method for fabricating semiconductor packages of claim 6, before the step of applying the second photo resist layer over the bottom surface of the first molding encapsulation and the plurality of semiconductor devices, further comprising applying a second seed layer over the bottom surface of first molding encapsulation and the plurality of semiconductor devices; and after the step of removing the second photo resist pattern, further comprising
  removing the second seed layer.

8. The method for fabricating semiconductor packages of claim 1, wherein a height of the plurality of pillars is the same as or higher than a thickness of the plurality of semiconductor devices.

9. The method for fabricating semiconductor packages of claim 1, wherein a thickness of the first molding encapsulation is substantially the same as a thickness of the plurality of semiconductor devices.

10. The method for fabricating semiconductor packages of claim 1, wherein the second molding encapsulation directly contacts top surfaces of the first plurality of electrical interconnections; and wherein the top surfaces of the first plurality of electrical interconnections do not expose from a top surface of the second molding encapsulation.

11. The method for fabricating semiconductor packages of claim 10, wherein the first plurality of electrical interconnections do not expose from the top surface of the second molding encapsulation.

12. A method for fabricating semiconductor packages, the method comprising the steps of:
  providing a removable carrier;
  forming a plurality of pillars on a top surface of the removable carrier;
  attaching a plurality of semiconductor devices to the top surface of the removable carrier;
  forming a first molding encapsulation so that top surfaces of the plurality of pillars and top surface electrodes of the plurality of semiconductor devices are exposed from a top surface of the first molding encapsulation;
  applying a first photo resist layer over the top surface of the first molding encapsulation;
  developing a first photo resist pattern using a first patterned mask under a first exposure process;
  applying a first redistribution layer (RDL) over an exposed top surface of the first molding encapsulation and the top surface electrodes of the plurality of semiconductor devices forming a first plurality of electrical interconnections;
  removing the first photo resist pattern;
  forming a second molding encapsulation enclosing the first plurality of electrical interconnections;
  removing the removable carrier;
  applying a second photo resist layer over a bottom surface of the first molding encapsulation and the plurality of semiconductor devices;
  developing a second photo resist pattern using a second patterned mask under a second exposure process;
  applying a second RDL over an exposed bottom surface of the first molding encapsulation and the plurality of semiconductor devices forming a second plurality of electrical interconnections;
  removing the second photo resist pattern; and
  applying a singulation process forming the semiconductor packages;
  wherein a bottom surface of the second molding encapsulation is directly attached to the top surface of the first molding encapsulation in a region directly between one pillar of the plurality of pillars and one semiconductor device of the plurality of semiconductor devices; and
  wherein the one pillar of the plurality of pillars and the one semiconductor device of the plurality of semiconductor devices are contained in a same semiconductor package of the semiconductor packages.

13. The method for fabricating semiconductor packages of claim 12, wherein the second molding encapsulation directly contacts top surfaces of the first plurality of electrical interconnections; and wherein the top surfaces of the first plurality of electrical interconnections do not expose from a top surface of the second molding encapsulation.

14. The method for fabricating semiconductor packages of claim 13, wherein the first plurality of electrical interconnections do not expose from the top surface of the second molding encapsulation.

\* \* \* \* \*